(12) United States Patent
Lu et al.

(10) Patent No.: US 9,748,205 B2
(45) Date of Patent: Aug. 29, 2017

(54) MOLDING TYPE POWER MODULE

(71) Applicant: DELTA ELECTRONICS, INC., Taoyuan Hsien (CN)

(72) Inventors: Kai Lu, Taoyuan Hsien (CN); Zhenqing Zhao, Taoyuan Hsien (CN); Tao Wang, Taoyuan Hsien (CN); Le Liang, Taoyuan Hsien (CN)

(73) Assignee: DELTA ELECTRONICS, INC., Taoyuan, Taiwan (CN)

( * ) Notice: Subject to any disclaimer, the term of this patent is extended or adjusted under 35 U.S.C. 154(b) by 0 days.

(21) Appl. No.: 15/081,365

(22) Filed: Mar. 25, 2016

(65) Prior Publication Data

US 2016/0381785 A1 Dec. 29, 2016

(30) Foreign Application Priority Data

Jun. 25, 2015 (CN) .......................... 2015 1 0357533

(51) Int. Cl.
*H01L 23/495* (2006.01)
*H01L 25/065* (2006.01)
*H01L 23/31* (2006.01)
*H05K 1/02* (2006.01)
*H05K 3/28* (2006.01)

(52) U.S. Cl.
CPC ...... *H01L 25/0657* (2013.01); *H01L 23/3107* (2013.01); *H01L 23/49517* (2013.01); *H01L 23/49531* (2013.01); *H01L 23/49551* (2013.01); *H01L 23/49562* (2013.01); *H01L 23/49575* (2013.01); *H01L 23/49589* (2013.01); *H05K 1/0263* (2013.01); *H01L 2224/16225* (2013.01); *H01L 2224/48137* (2013.01); *H01L 2224/73204* (2013.01); *H01L 2224/73265* (2013.01); *H01L 2225/06572* (2013.01); *H01L 2924/181* (2013.01); *H01L 2924/19105* (2013.01); *H05K 3/284* (2013.01); *H05K 2201/10166* (2013.01); *H05K 2203/1316* (2013.01)

(58) Field of Classification Search
CPC ......... H01L 25/074; H01L 2224/48145; H01L 23/49575; H01L 2224/32145; H01L 25/0657
USPC .......................... 257/666, 676, 691, 686, 777
See application file for complete search history.

(56) References Cited

U.S. PATENT DOCUMENTS 5,245,215 A * 9/1993 Sawaya ............... H01L 23/3107
257/676
2004/0251529 A1* 12/2004 Lee ......................... H01L 23/50
257/686

(Continued)

*Primary Examiner* — S. V. Clark
(74) *Attorney, Agent, or Firm* — Yunling Ren

(57) ABSTRACT

A molding type power module includes: a leadframe including a first step and a second step; a first planar power device including a first surface having electrodes and a second surface opposite to the first surface, the electrodes being correspondingly bond to the first step respectively; and a second planar power device including a first surface having electrodes and a second surface opposite to the first surface, the electrodes being correspondingly bond to the second step respectively, wherein, the first surface of the first planar power device and the first surface of the second planar power device face each other, the projected areas thereof on a vertical direction at least partially overlap, and the first planar power device at least has one electrode electronically connected with the electrodes of the second planar power device.

20 Claims, 17 Drawing Sheets

(56) References Cited

U.S. PATENT DOCUMENTS

| | | | |
|---|---|---|---|
| 2005/0224945 A1* | 10/2005 | Saito | H01L 23/49575 257/686 |
| 2006/0194366 A1* | 8/2006 | Lee | H01L 23/50 438/106 |
| 2008/0006923 A1* | 1/2008 | Otremba | H01L 23/49551 257/686 |
| 2011/0215460 A1* | 9/2011 | Otremba | H01L 21/561 257/690 |
| 2012/0181706 A1* | 7/2012 | Zeng | H01L 23/49524 257/777 |
| 2013/0146991 A1* | 6/2013 | Otremba | H01L 25/071 257/401 |

* cited by examiner

MOLDING TYPE POWER MODULE

TECHNICAL FIELD

The present disclosure relates to the field of a power module technology, and more particularly, to a molding type power module.

BACKGROUND

In the field of power electronics, development of semiconductor device is going on for being large capacity, high frequency and integrated. Since the application of IGBT (Insulated-Gate Bipolar Transistor) from 1980s, the performance of silicon device in many aspects is close to the theory limit. There is no more development space for improving the overall performance of power electronic devices by innovating the principle of devices, improving the structure of the devices, or improving the manufacture process of the devices. To improve the overall performance of power electronic devices, new semiconductor devices (e.g. new type wide bandgap semiconductor devices) made by new materials is developed, such as SiC and GaN. Relevant mature devices are pushed into market constantly in the recent 10 years and have been widely used in light of their advantages of high temperature stability and better high frequency characteristics.

As the whole system work in higher frequency by the application of the new type wide bandgap semiconductor devices, it is necessary that the package of the power module provided with the new type wide bandgap semiconductor devices is optimized by means of improving materials and process or the like, so that loop parasitic parameters in the power module can be smaller.

In the field of the package of the power module, as the number of the electrode pads of the power semiconductor devices is limited, and loop parasitic parameters in the power module working in low and medium frequency (dozens of KHz to hundreds of KHz) have no significant impact on the spike voltage and switch loss, the conventional package of the power module still uses electric connection ways which are mainly wire bonding.

SUMMARY

The present disclosure uses the following technical solutions:

A molding type power module, including: a leadframe, a first planar power device and a second planar power device. The leadframe including a first step and a second step; the first planar power device including a first surface having electrodes and a second surface opposite to the first surface, the electrodes being correspondingly bond to the first step respectively; the second planar power device including a first surface having electrodes and a second surface opposite to the first surface, the electrodes being correspondingly bond to the second step respectively, wherein, the first surface of the first planar power device and the first surface of the second planar power device face each other, and projected areas of first surface of the first planar power device and the first surface of the second planar power device thereof in a vertical direction at least partially overlap, and the first planar power device at least has one electrode electronically connected with the electrodes of the second planar power device.

The present disclosure further provides another molding type power module, including: a substrate, a first planar power device, and a second planar power device. The substrate including a first surface and a second surface, a plurality of wire terminals being on the first surface and the second surface respectively; the first planar power device including a first surface having electrodes and a second surface opposite to the first surface, the electrodes being correspondingly bond to the wire terminals of the first surface of the substrate respectively; and the second planar power device including a first surface having electrodes and a second surface opposite to the first surface, the electrodes being correspondingly bond to the wire terminals of the second surface of the substrate respectively, wherein, the first surface of the first planar power device and the first surface of the second planar power device face each other, and the projected areas of first surface of the first planar power device and the first surface of the second planar power device thereof in a vertical direction at least partially overlap, and the first planar power device at least has one electrode electrically connected with the electrodes of the second planar power device.

DETAILED DESCRIPTION

Figure 1:
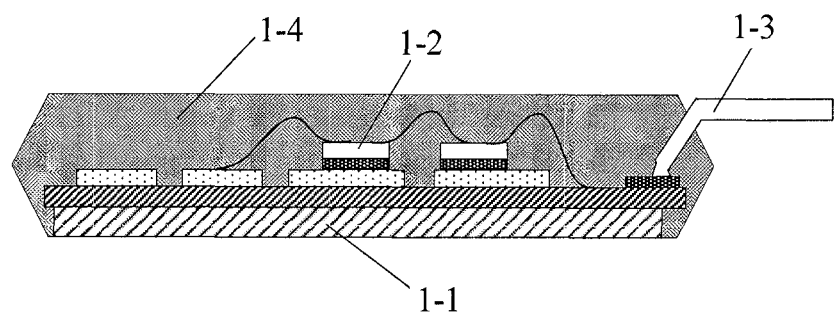
FIG. 1 shows a conventional molding type module package structure.

Detailed description of the present disclosure will be made with reference to drawings and embodiments. It shall be appreciated that the embodiments described herein are for the purposes of illustration but not to limit the present disclosure. In addition, it shall be noted that only the parts related to the present disclosure but not all the structures are shown in the drawings for the convenience of description.

FIG. 1 shows a conventional package structure of molding type module. A DBC (Direct Bonding Copper) substrate 1-1 serves as a mounting support plate of a device 1-2, wiring is formed on the substrate 1-1 and the device 1-2 is assembled with the DBC substrate 1-1. Electrodes of the device 1-2 need to connect a leadframe 1-3 of the DBC substrate 1-1 by wire bonding. Finally, molding compounds cover the device 1-2 and the DBC substrate 1-1, and pins of the leadframe 1-3 are electrically connected to external circuits. The molding compounds have a function for the whole structure as mechanical support and electric protection.

Figure 2:
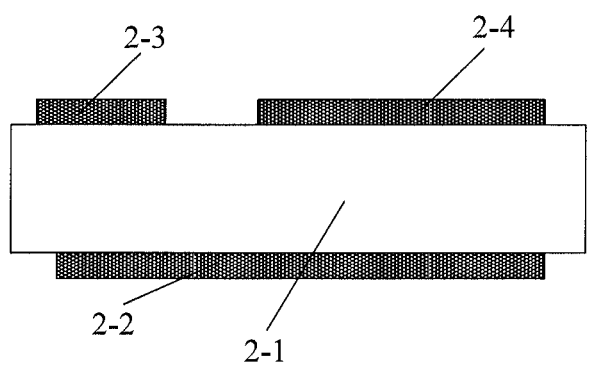
FIG. 2 shows the electrode pads distribution of a vertical type power semiconductor device.
Figure 3:
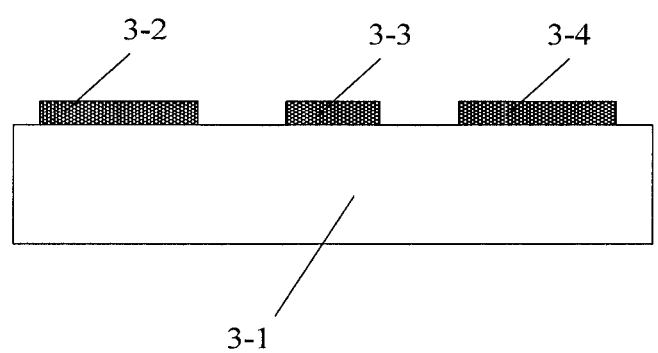
FIG. 3 shows the electrode pads distribution of a planar power semiconductor device.

However, in the field of the package of module with low and medium power (equal to or lower than 3000 W), higher frequency of the module, to reach higher power density, the module needs to work in high frequency. Being different from the vertical structure of conventional power semiconductor devices (such as IGBT, MOS), the planar structure of the new type wide bandgap semiconductor devices (GaN or the like) makes the package manner more diversity. FIG. 2 shows the electrode pads distribution of the vertical type power semiconductor device; and FIG. 3 shows the electrode pads distribution of the planar power semiconductor device. Compared with FIG. 2 and FIG. 3, it can be seen that the gate 2-3 and source 2-4 of the vertical type power semiconductor device 2-1 in FIG. 2 are in one side of the power semiconductor device 2-1, while the drain 2-2 is in the other side of the power semiconductor device 2-1; and the gate 3-3, source 3-4 and drain 3-2 of the planar power semiconductor device 3-1 in FIG. 3 are in the same side of the power semiconductor device 3-1. Therefore, it is necessary to develop a corresponding technology based on the new type planar power semiconductor device, which makes the power module based on the planar power semiconductor device have smaller loop parasitic parameter.

Figure 4:
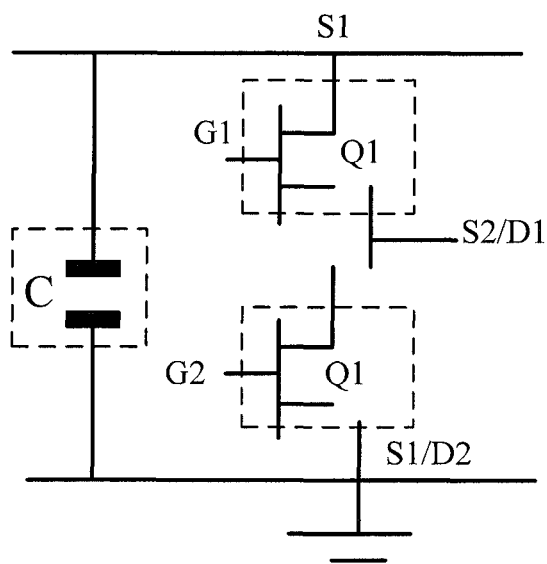
FIG. 4 shows a typical half bridge topology structure composed by two power semiconductor devices connected in series.

Generally, a basic unit constituting the circuit topology is usually composed of two power semiconductor devices Q1, Q2 and one capacitor C. FIG. 4 shows a typical half bridge topology structure composed by two power semiconductor devices connected in series. The topology is usually the basic unit composing the complex circuit topology, so its application is extremely wide. In addition, the topology structure with two power semiconductor devices connected in parallel is also applied in some occasions.

Figure 5:
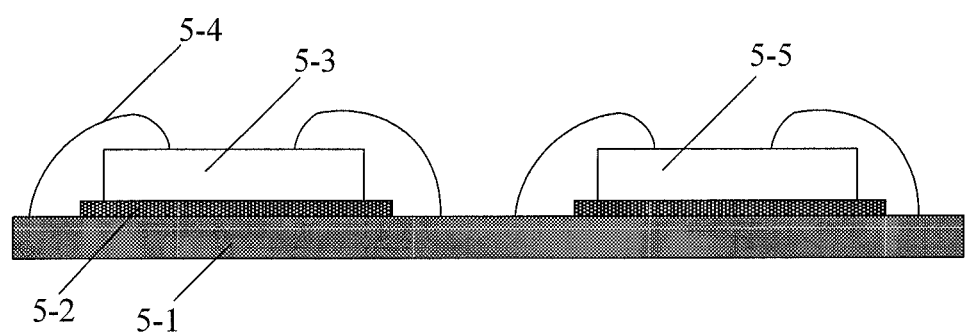
FIG. 5 shows an implementation of the power semiconductor device and the substrate are connected by wire in the half bridge topology structure in the related art.
Figure 6:
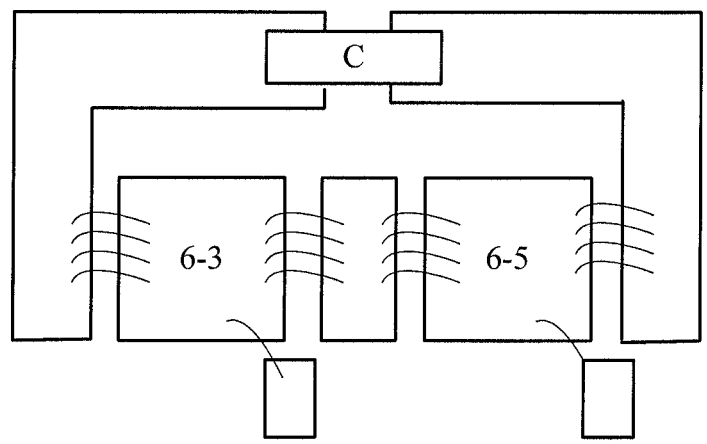
FIG. 6 is a plan view of FIG. 5.

Currently, in the package of planar power semiconductor device the planar power semiconductor device and the substrate are electrically connected mainly by wire bonding or flip chip. FIG. 5 shows an implementation of the power semiconductor device and the substrate are electrically connected by wire in the half bridge topology structure. The reference numerals 5-3 and 5-5 in FIG. 5 represent the power semiconductor devices Q1 and Q2 in FIG. 4 respectively, and both of the two power semiconductor devices are planar power semiconductor devices. The planar power semiconductor devices 5-3 and 5-5 are attached to the substrate 5-1 by the attach material (solder, epoxy or the like), and then the electrode pads such as the drain, source and gate of the planar power semiconductor devices are electrically connected to the substrate wiring pads by the connection wire 5-4 (copper wire, aluminium wire or the like). FIG. 6 shows the plan view of FIG. 5, wherein the reference numerals 6-3 and 6-5 in FIG. 6 represent the planar power semiconductor devices 5-3 and 5-5 in FIG. 5 respectively. Because such structure is affected by the size of the planar power semiconductor device, the process of wire bonding or the like, the distance between each electrode pad is relatively long, and the actual current loop of the half bridge topology structure is relatively large, resulting in a larger loop parasitic parameter. The loop parasitic parameter will increase the loop loss and spike voltage, which is disadvantageous to the half bridge topology structure working in the high frequency condition.

Figure 7:
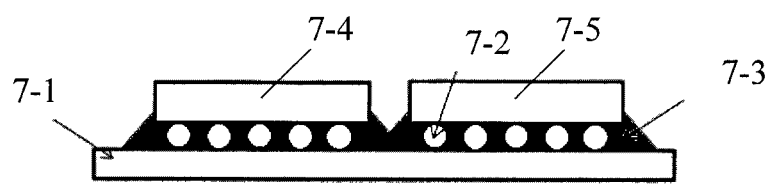
FIG. 7 shows another implementation of the power semiconductor device and the substrate are connected by flip chip in the half bridge topology structure in the related art.

FIG. 7 shows another implementation of the power semiconductor device and the substrate are connected by flip chip in the half bridge topology structure. The reference numerals 7-4 and 7-5 in FIG. 7 represent the power semiconductor devices Q1 and Q2 in FIG. 4 respectively, and both of the two power semiconductor devices are planar power semiconductor devices. The planar power semiconductor devices 7-4 and 7-5 are flipped on the substrate 7-1, interconnection of the power semiconductor device pad and the substrate pad may be achieved by forming bumps 7-2 on the pad of the planar power semiconductor devices 7-4 and 7-5 with solder, aluminum, copper or the like. The implementation of flip chip may reduce the additional size brought by wire bonding (such as the space needed by the arc of wirings, advancing and retreating of the tools, the size of the substrate pads, and the like), thereby reducing the current loop of the half bridge topology structure effectively. However, in the implementation of two planar power semiconductor devices within the molding are still arranged in parallel. The interconnection between the electrode pads of the two planar power semiconductor devices still needs to step across the size of the planar power semiconductor device, so there is further improvement space to optimize the package of the power module. Besides, molding compound is formed on one side of the package structure, i.e. on one side of the substrate, and warping may occur due to large internal stress of the package structure caused by the difference between the heat expansion coefficients of material.

The First Embodiment

Figure 8A:
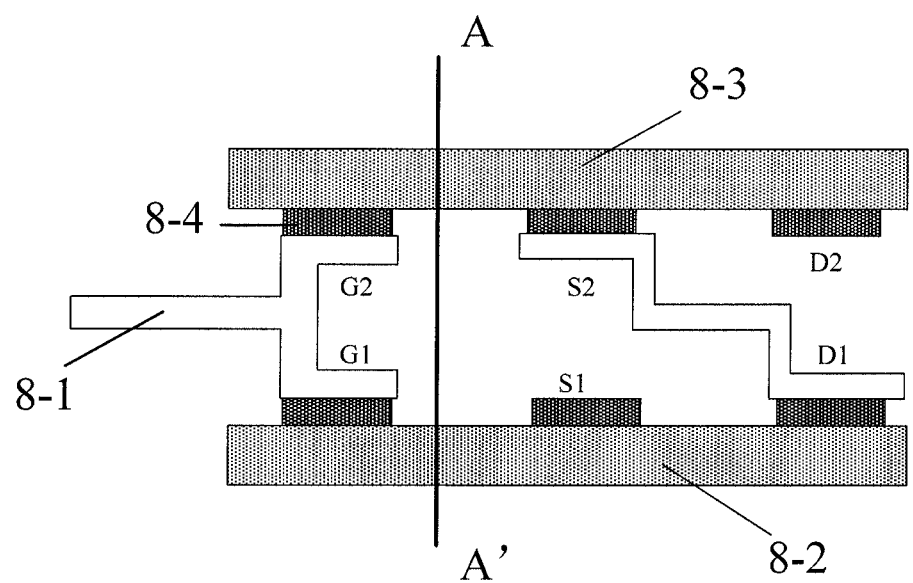
FIG. 8A shows a side view of a molding type power module according to the first embodiment of the present disclosure.
Figure 8B:
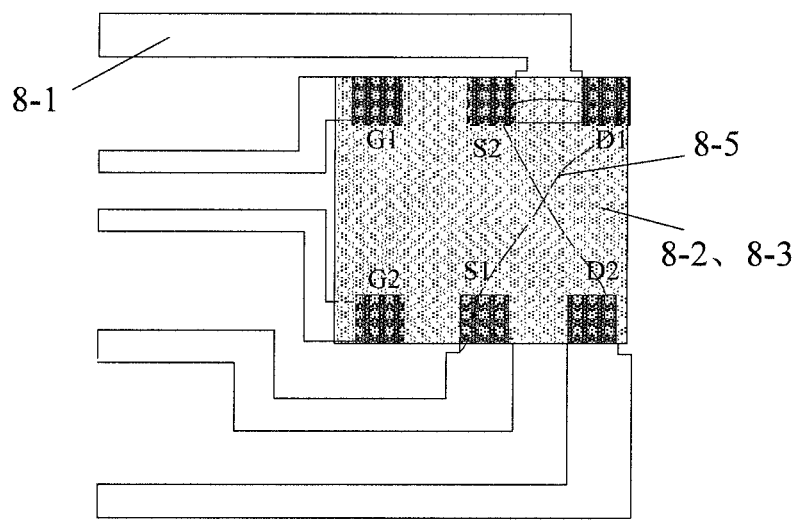
FIG. 8B shows a plan view of the molding type power module according to the first embodiment of the present disclosure.

The present embodiment provides a molding type power module, whose side view is shown in FIG. 8A and whose top view is shown in FIG. 8B. The molding type power module includes a leadframe 8-1 which has a first step, a second step, a first planar power device 8-2 and a second planar power device 8-3. Here, as an example, the first planar power device 8-2 and the second planar power device 8-3 are GaN device. The first planar power device and the second planar power device may also be other types of planar power devices. Herein, the first planar type power device 8-2 includes a gate G1, a source S1 and a drain D1, and the second flat-type power device 8-3 includes a gate G2, a source S2 and a drain D2. The gate G1, source S1 and drain D1 are located on the same surface (i.e., a first surface) of the first planar power device 8-2 and are correspondingly bond to the first step of the leadframe 8-1 respectively. The gate G2, source S2 and drain D2 are located on the same surface (i.e., a first surface) of the second planar power device 8-3 and are correspondingly bond to the second step of the leadframe 8-1 respectively. The first planar power device 8-2 and the second planar power device 8-3 also have a second surface having no electrodes thereon opposite to their first surface, respectively. The first surface of the first planar power device provided with the gate G1, source S1 and drain D1 and the first surface of the second planar power device provided with the gate G2, source S2 and drain D2 face each other, and the projected areas thereof partially overlap on the vertical direction (i.e. the direction of A-A' in FIG. 8A). The drain D1 of the first planar power device 8-2 is electrically connected with the source S2 of the second planar power device 8-3, or the source S1 of the first planar power device 8-2 is electrically connected with the drain D2 of the second planar power device 8-3.

In particular, double steps (i.e. the above first step and the second step) are formed by stamping, etching or the like on the leadframe 8-1, and then electrode pads (G1/S1/D1, G2/S2/D2) of the two planar power devices 8-2 and 8-3 constituting the half bridge topological structure are bonded to the two steps of the leadframe 8-1 by binding material 8-4. The binding material 8-4 may be solder, bump, conductive silver paste, conductive epoxy and the like. The first step and the second step forms a plurality of pins on the leadframe 8-1 respectively, to connect the electrodes (G1, S1, G2, D2) of the two planar power devices 8-2 and 8-3 to external circuits.

Figure 9:
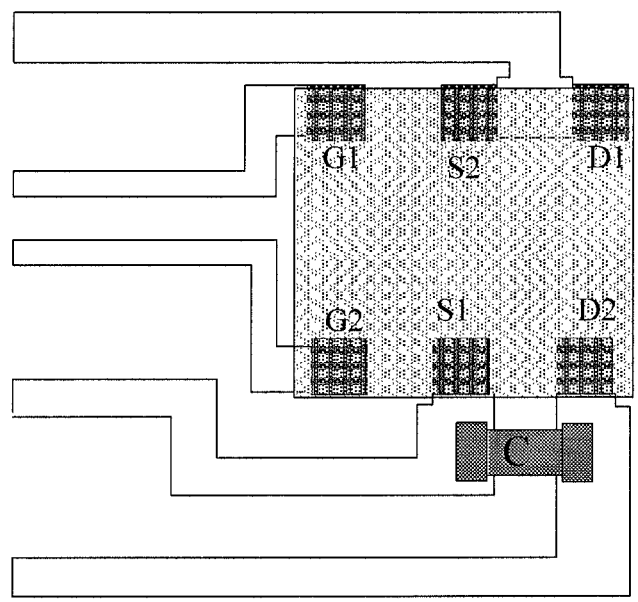
FIG. 9 shows a side view of the molding type power module including a capacitor according to the first embodiment of the present disclosure.
Figure 10:
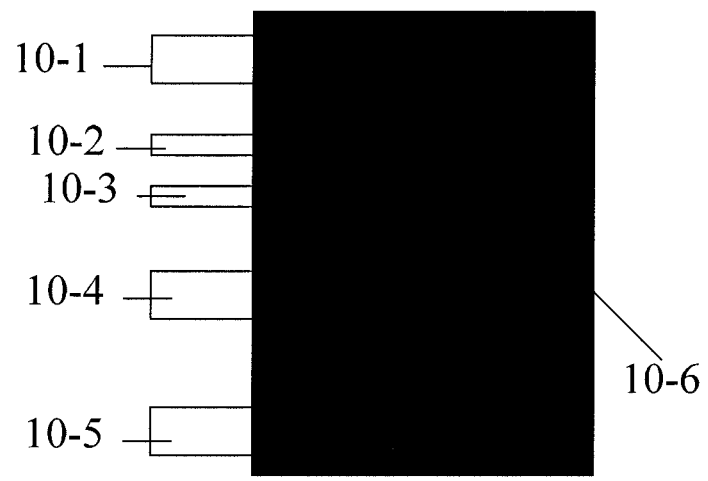
FIG. 10 is a structural schematic diagram of the molding type power module after filling with the molding compounds according to the first embodiment of the present disclosure.

The molding type power module provided by the present embodiment includes at least two electrically connected planar power devices. The surfaces of the two planar power devices provided with electrodes are arranged face to face. The face to face arrangement may be aligned or there may be also certain misplacement. When they are aligned, because the projected areas of the two planar power devices entirely overlap, the electrical wiring connecting the two planar power devices are distributed only within the vertical projection scope of the planar power devices. When there is certain misplacement between the two planar power devices, because the two planar power devices still have a part of projection area overlapped, the electrical wiring connecting the two planar power devices is still shorter than the path when the two planar power devices are parallelly arranged. The connection line 8-5 in FIG. 8B shows a part of the current loop flowing through the two planar power devices. It can be seen that, because the two planar power devices in FIG. 8B are aligned, the current loop flowing through the two planar power devices is distributed only within the vertical projection scope of the planar power devices. Compared with the current loops of FIG. 5 and FIG. 7, the area of current loop is greatly reduced, and it is certain that the loop parasitic parameter and spike voltage of the package module are greatly reduced. Therefore, it is more suitable for high frequency application. Considering the protection for the whole structure, the periphery of the first planar power device, the second planar power device and a plurality of pins are usually filled with molding compounds to form a package body, that is, to cover the first planar power device, the second planar power device and a part of the plurality of pins with the molding compounds. Considering further reduction of the current loop, the capacitor C in the half bridge topological structure may be put into the interior of the package body, the capacitor C is electrically mounted to two of the plurality pins of the leadframe. As shown in FIG. 9, the capacitor C is electrically mounted to the source S1 of the first planar power device and the drain D2 of the second planar power device, and the capacitor, the first planar power device, the second planar power device and a part of the plurality of pins are covered with the molding compounds. FIG. 10 is a structure after filling with the molding compounds, the electrical connection between the power module and the external circuit may be achieved by the pins 10-1, 10-2, 10-3, 10-4 and 10-5 exposed from the molding compounds 10-6. For description clarity, it is not specifically illustrated in FIG. 10. In fact, the molding compounds cover the first planar power device, the second planar power device and a part of the plurality of pins, to form the package body. The plurality of pins may extend from the molding compounds in many different ways, which will be illustrated specifically in the following embodiments.

The molding type power module provided by the present embodiment has the following advantages. Firstly, it has a simple and reliable structure and a low cost. Compared with the conventional package structure with ceramic substrate, the module directly uses leadframe to achieve electrical interconnection, avoiding the asymmetric structure as shown in FIG. 5 with one side being a substrate and one side being the molding compounds, which therefore reduces the internal stress of the package body effectively and reduces the warping of the package body. Besides, binding material is used for the interconnection of the planar power devices and thus wire bonding process is not required, which therefore reduces the processing steps and reducing the production cost. Furthermore, in view of package efficiency (the area ratio of the area occupied by the planar power devices within the package body), because the two planar power devices are arranged face to face, the area ratio of the planar power device occupied within the package body is reduced effectively, thus improving the package efficiency. Finally, the half bridge topological structure can shorten the current loop flowing through the two planar power devices effectively, thus reducing the loop parasitic parameter due to the package, and improving the efficiency of the power module.

Figure 11:
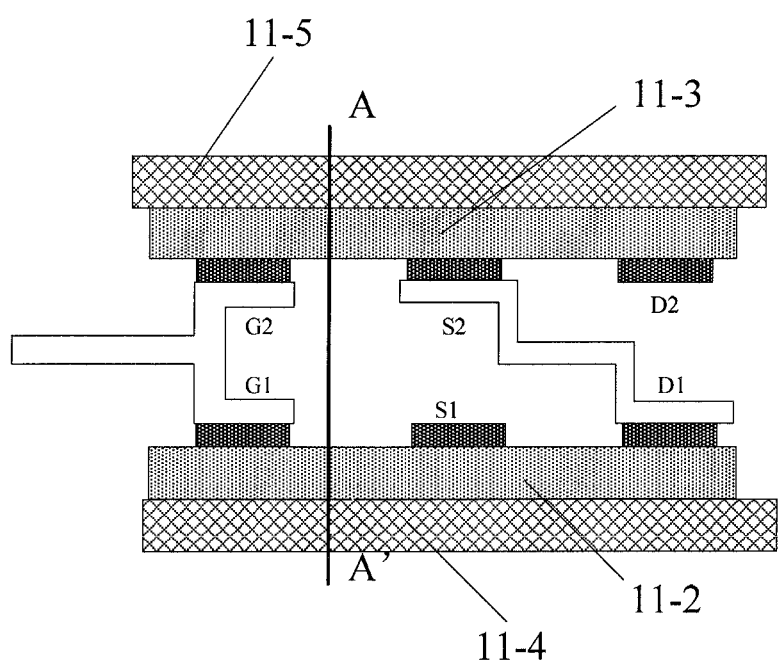
FIG. 11 shows a side view of the molding type power module including a heatsink according to the first embodiment of the present disclosure.

In a preferred embodiment, a heatsink may be bond to the second surface of the planar power device, and a part of the heatsink may be covered by the molding compounds. FIG. 11 shows a schematic diagram of a package structure where the heatsink is bond to the rear surface of the planar power device. In FIG. 11, the heatsinks 11-4 and 11-5 are attached to the second surfaces of the planar power devices 11-2 and 11-3 respectively, to facilitate a timely dissipation of the heat produced by the planar power devices, and to improve the reliability of the planar power devices. The molding compounds cover the first planar power device, the second planar power device, a part of the plurality of pins and a part of the heatsink 11-4 and 11-5 to from a package body. In other embodiments, a heatsink may also be attached to the second surface of the planar power device 11-2, or a heatsink may also be attached to the second surface of the planar power device 11-3. The molding compounds cover the first planar power device, the second planar power device, a part of the plurality of pins and a part of the heatsink to from a package body.

In addition, because of the development of the technology of molding compounds such as high thermal conductive package resin, with the continuous improvement of thermal conductivity, the package resin itself will also become a good thermal conductor, which means that the planar power devices can also dissipate heat via the package resin.

The Second Embodiment

Figure 12:
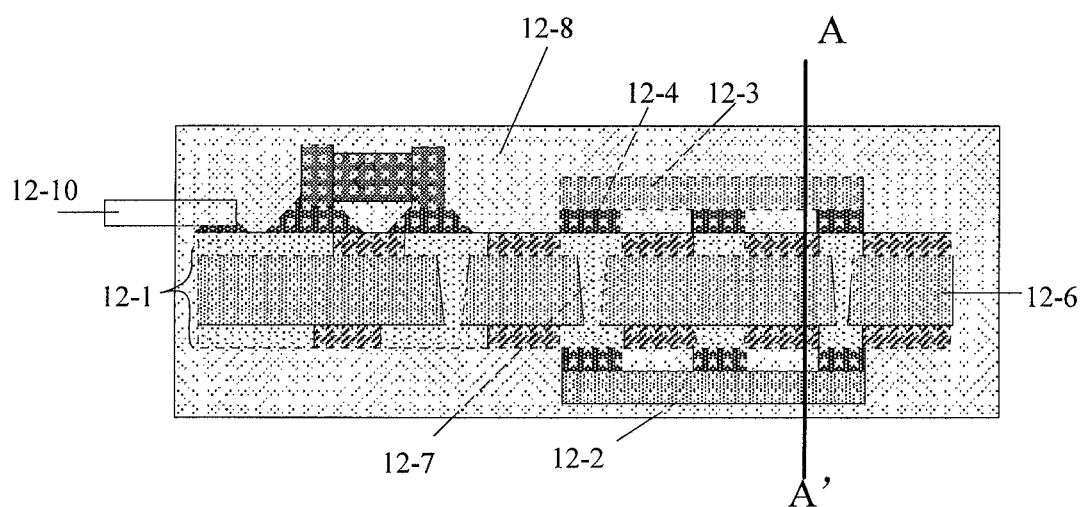
FIG. 12 shows a side view of a molding type power module according to the second embodiment of the present disclosure.

The present disclosure also provides another molding type power module. Compared with the first embodiment, in order to improve the flexibility of wiring, the molding type power module uses PCB (printed circuit board) as the substrate material. FIG. 12 shows its structural schematic diagram.

As shown in FIG. 12, the power module includes a PCB substrate 12-1. The PCB substrate is fabricated by a glass fiber core 12-6 and a copper layer 12-7 via a pressing process. If there are two layers or multiple layers of copper foils, drilling and electroplating processes are used to achieve electrical interconnections among the copper foils. The PCB substrate 12-1 has a first surface and a second surface. There are a plurality of wire terminals on the first surface. A first planar power device 12-2 is carried on the first surface of the PCB substrate 12-1. The surface of the first planar power device 12-2 provided with the gate, source and drain is electrically connected with the first surface of the PCB substrate 12-1 via the plurality of wire terminals. There are a plurality of wire terminals on the second surface. A second planar power device 12-3 is carried on the second surface of the PCB substrate 12-1. The surface of the second planar power device 12-3 provided with the gate, source and drain is electrically connected with the second surface of the PCB substrate 12-1 via the plurality of wire terminals.

The first surface of the first planar power device 12-2 provided with the gate, source and drain faces the first surface of the second planar power device 12-3 provided with the gate, source and drain. The electrodes are connected to the copper layer 12-7 (i.e. the wire terminal on the PCB substrate) via the binding material 12-4. The electrodes of the first planar power device 12-2 are electronically connected with the electrodes of the second planar power device 12-3 via the copper layer 12-7, and the projected areas of the two planar power devices on the vertical direction (i.e. the direction of A-A' in FIG. 12) at least partially overlap. Besides, The drain D1 of the first planar power device 12-2 is connected with the source S2 of the second planar power device 12-3, or the source S1 of the first planar power device 12-2 is connected with the drain D2 of the second planar power device 12-3. The first planar power device 12-2 and the second planar power device 12-3 also have a second surface (i.e. a surface having no electrodes thereon) opposite to their first surfaces, respectively.

In a preferred implementation, the first surface of the first planar power device 12-2 (i.e. the surface provided with the gate, source and drain) is aligned with the first surface of the second planar power device 12-3 (i.e. the surface provided with the gate, source and drain) on the vertical direction, the projected areas thereof on the vertical direction entirely overlap.

By packaging in this way, because the two planar power devices are arranged face to face, the area ratio of the planar power device occupied in the package body is reduced effectively, and thus the package efficiency of the power device is improved. Besides, such packaging may shorten the circuit loop flowing through the two planar power devices, and shorten the current loop of the circuit half bridge topological structure Thus, the loop parasitic parameter brought by the package is reduced and the efficiency of the power module is improved.

The molding type power module further includes a plurality of pins 12-10 which are connected to the PCB substrate 12-1 via the binding material 12-4. The molding type power module is connected with external circuits via the plurality of pins 12-10.

The molding type power module further includes molding compounds 12-8. The molding compounds cover the substrate, the first planar power device 12-2, the second planar power device 12-3 and a part of a plurality of pins 12-10, to form the package body.

Heatsinks may be attached to the second surfaces of the first planar power device 12-2 and the second planar power device 12-3 respectively, to improve the heat dissipation effect of the device. Heatsinks may also be attached to the second surface of the first planar power device 12-2 or the second planar power device 12-3, to improve the heat dissipation effect of the device.

The molding type power module further includes a capacitor. The capacitor is electronically mounted to the first surface of the PCB substrate or the wire terminal of the second surface, which may shorten the circuit loop of the power module. In the present embodiment, the molding compounds may also clad the substrate, the capacitor, the first planar power device 12-2, the second planar power device 12-3 and a part of a plurality of pins 12-10, to form a package body.

The molding type power module further includes the molding compounds 12-8. The molding compounds cover the substrate, the first planar power device 12-2, the second planar power device 12-3, a part of a plurality of pins 12-10 and a part of the heatsink (not shown in FIG. 12), to form a package body.

Using PCB as the substrate material, it may achieve less wiring width and may provide more planar power devices or passive devices in the package body, thereby further improving the package efficiency. In addition, the substrate, for example a multilayer ceramic substrate such as low temperature Co-fired ceramic or high temperature Co-fired ceramic and so on, may also achieve such a structure.

Figure 13A:
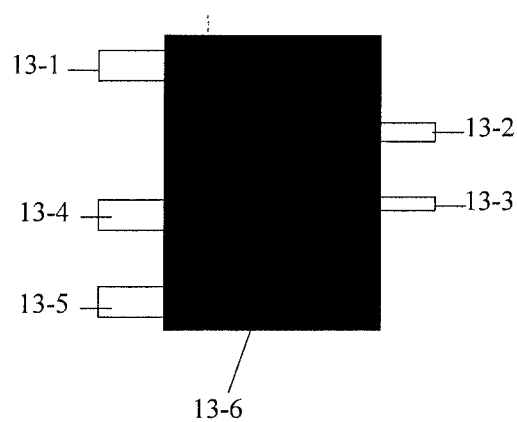
FIGS. 13A-13D show several different ways that the pins stretch out of molding type power module according to embodiments of the present disclosure.
Figure 13B:
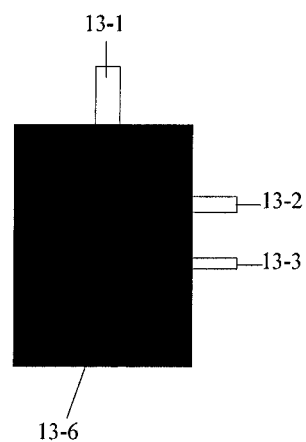
Figure 13C:
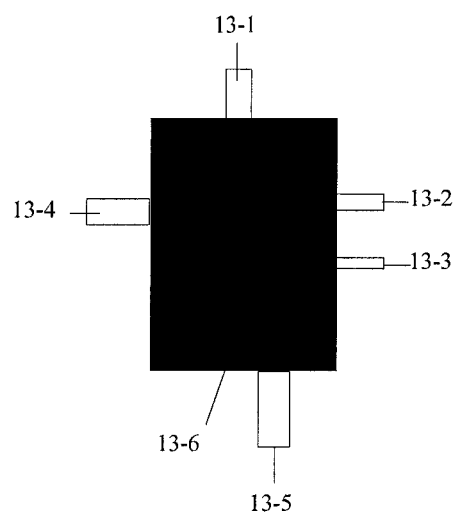
Figure 13D:
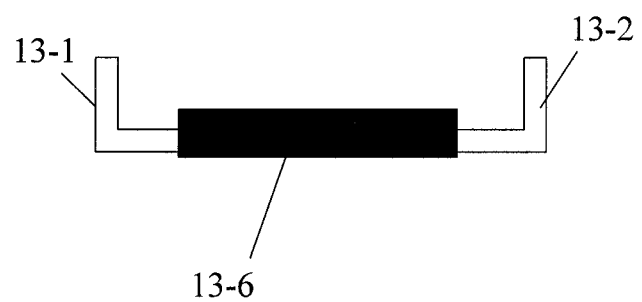

FIGS. 13A-13D illustrate stretching the pins out in various manners. Compared with the single column pins as shown in FIG. 10, the pins may be distributed on any side of the package body. As shown in FIG. 13A, the pins 13-1, 13-4 and 13-5 are distributed on the left side of the package body 13-6, and the pins 13-2 and 13-3 are distributed on the right side of the package body 13-6; as shown in FIG. 13B, the pin 13-1 is distributed on the upper side of the package body 13-6, and the pins 13-2 and 13-3 are distributed on the left side of the package body 13-6; and as shown in FIG. 13C, the pin 13-1 is distributed on the upper side of the package body 13-6, the pins 13-2 and 13-3 are distributed on the right side of the package body 13-6, the pin 13-5 is distributed on the lower side of the package body 13-6, and the pin 13-4 is distributed on the left side of the package body 13-6. In addition, the pins may be bent into any direction. The pins are bent into a straight plugging form in FIG. 13D (for plug-in mounting). Besides, the pins may also be bent into L type or J type (for surface mount). The above pins may also be applied to the pins in the first embodiment.

The present disclosure provides a new technical solution for optimizing the package of the power module. A molding type power module is provided, which uses a structure that the planar power devices are arranged face to face, thereby reducing the parasitic parameter in the power module, and meanwhile reducing the package size of the power module and reducing the package cost, to meet the pursuit for high efficiency, high power density and low cost.

It shall be noted that the above descriptions only illustrate preferable embodiments and technology principles of the present disclosure. One of ordinary skill in this art will appreciate that the present disclosure is not limited to the particular embodiments described herein, and one of ordinary skill in this art may make various obvious changes, re-adjustments and substitutions without departing from the protection scope of the present disclosure. Thus, although the present disclosure is described in detail with reference to the above embodiments, the present disclosure is not limited to those embodiments, and other equivalent embodiments may be included without departing from the concept of the present disclosure. The scope of the present disclosure is defined by the scope of the appended claims.

What is claimed is:
1. A molding type power module, comprising:
a leadframe comprising a first step and a second step;
a first planar power device comprising a first surface having electrodes and a second surface opposite to the first surface, the electrodes being correspondingly bond to the first step respectively; and a second planar power device comprising a first surface having electrodes and a second surface opposite to the first surface, the electrodes being correspondingly bond to the second step respectively, wherein, the first surface of the first planar power device and the first surface of the second planar power device face each other and have projected areas in a vertical direction which are at least partially overlapped, and the first planar power device has at least one electrode electronically connected with that of the second planar power device.

2. The molding type power module according to claim 1, wherein the first step and the second step form a plurality of pins on the leadframe respectively.

3. The molding type power module according to claim 2, wherein the molding type power module further comprises a capacitor, which is electrically mounted to two of the plurality of pins.

4. The molding type power module according to claim 2, wherein the molding type power module further comprises molding compounds, which cover the first planar power device, the second planar power device and a part of the plurality of pins.

5. The molding type power module according to claim 3, wherein the molding type power module further comprises molding compounds, which cover the capacitor, the first planar power device, the second planar power device and a part of the plurality of pins.

6. The molding type power module according to claim 1, wherein the first surface of the first planar power device and the first surface of the second planar power device are aligned along the vertical direction and the projected areas in the vertical direction are entirely overlapped.

7. The molding type power module according to claim 1, wherein the molding type power module further comprises a heatsink, which is attached to the second surface of the first planar power device or the second surface of the second planar power device.

8. The molding type power module according to claim 2, wherein the pins are distributed on at least one side of the molding type power module.

9. The molding type power module according to claim 2, wherein the pins are bent into L type or J type.

10. A molding type power module, comprising:
a substrate comprising a first surface and a second surface which have a plurality of wire terminals thereon respectively;
a first planar power device comprising a first surface having electrodes and a second surface opposite to the first surface, the electrodes being correspondingly bond to the wire terminals of the first surface of the substrate respectively; and
a second planar power device comprising a first surface having electrodes and a second surface opposite to the first surface, the electrodes being correspondingly bond to the wire terminals of the second surface of the substrate respectively, wherein, the first surface of the first planar power device and the first surface of the second planar power device face each other and have projected areas in a vertical direction which are at least partially overlapped, and the first planar power device has at least one electrode electrically connected with that of the second planar power device, and wherein the substrate is a PCB substrate that carries the first planar power device and the second planar power device and serves as mounting support plate of the first planar power device and the second planar power device, and wherein the PCB substrate is fabricated by a glass fiber core and a copper layer via a pressing process.

11. The molding type power module according to claim 10, wherein the first surface of the first planar power device and the first surface of the second planar power device are aligned along the vertical direction and have projected areas in the vertical direction which are entirely overlapped.

12. The molding type power module according to claim 10, wherein the substrate comprises a plurality of pins, which are electrically connected with the wire terminals.

13. The molding type power module according to claim 10, wherein the molding type power module further comprises a capacitor, which is electrically bond to the wire terminals of the first surface of the substrate or the wire terminals of the second surface of the substrate.

14. The molding type power module according to claim 10, wherein the molding type power module further comprises a heatsink, which is bond to the second surface of the first planar power device or the second surface of the second planar power device.

15. The molding type power module according to claim 10, wherein the molding type power module further comprises a first heatsink and a second heatsink, the second surface of the first planar power device is attached to the first heatsink, and the second surface of the second planar power device is attached to the second heatsink.

16. The molding type power module according to claim 14, wherein the molding type power module further comprises molding compounds, which cover the substrate, the first planar power device, the second planar power device, a part of the plurality of pins and a part of the heatsink.

17. The molding type power module according to claim 12, wherein the molding type power module further comprises molding compounds, which cover the substrate, the first planar power device, the second planar power device and a part of the plurality of pins.

18. The molding type power module according to claim 13, wherein the molding type power module further comprises molding compounds, which cover the substrate, the capacitor, the first planar power device, the second planar power device and a part of the plurality of pins.

19. The molding type power module according to claim 12, wherein the pins are distributed on at least one side of the molding type power module.

20. The molding type power module according to claim 12, wherein the pins are bent into L type or J type.

* * * * *